(12) United States Patent
Bhandari et al.

(10) Patent No.: US 6,473,253 B1
(45) Date of Patent: Oct. 29, 2002

(54) READ CHANNEL WITH PROGRAMMABLE BANDWIDTH CONTROL

(75) Inventors: Sanjay Manohar Bhandari, Santa Clara, CA (US); David Allouche, Belmont, CA (US)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/300,901

(22) Filed: Apr. 28, 1999

(51) Int. Cl.[7] .................................................. G11B 5/09
(52) U.S. Cl. ............................ 360/46; 360/67; 330/85; 330/260
(58) Field of Search ............................ 360/46, 67, 65; 330/85, 254, 260, 294, 86, 302; G11B 20/10, 5/09

(56) References Cited

U.S. PATENT DOCUMENTS

| | | | |
|---|---|---|---|
| 3,882,540 A | * 5/1975 | Ottesen | 360/39 |
| 4,019,048 A | * 4/1977 | Maione et al. | 250/199 |
| 4,376,267 A | * 3/1983 | Chu et al. | 330/284 |
| 4,539,527 A | * 9/1985 | Ishigaki et al. | 330/149 |
| 4,839,573 A | * 6/1989 | Wise | 318/615 |
| 5,270,875 A | * 12/1993 | Shah et al. | 360/46 |
| 5,278,700 A | * 1/1994 | Sutliff et al. | 360/46 |
| 5,331,478 A | * 7/1994 | Aranovsky | 360/67 |
| 5,457,427 A | * 10/1995 | Wong et al. | 330/302 |
| 5,633,765 A | * 5/1997 | Lin et al. | 360/46 |
| 5,774,505 A | * 6/1998 | Baugh | 375/348 |
| 5,818,656 A | * 10/1998 | Klaassen et al. | 360/67 |
| 5,923,216 A | * 7/1999 | Pennock | 330/255 |
| 6,003,051 A | * 12/1999 | Okazaki | 708/3 |

FOREIGN PATENT DOCUMENTS

| | | | |
|---|---|---|---|
| EP | 0863609 A2 | 9/1998 | H03G/1/00 |
| GB | 2208053 A | 2/1989 | H03G/3/02 |
| JP | 62114313 | 11/1985 | H03G/3/10 |

* cited by examiner

Primary Examiner—David Hudspeth
Assistant Examiner—Dan I. Davidson
(74) Attorney, Agent, or Firm—John Vodopia (57) ABSTRACT

A feedback system includes an emitter-follower as a gain stage in the forward path. The emitter-follower has a very wide band width and does not, by itself, effectively narrow the bandwidth of an information channel in which it is used. Emitter-followers are frequently used as buffers in many gain systems so using an emitter-follower which is already present effectively reduces die area for the feedback system. In an embodiment, the feedback system includes a differentiator with a programmable zero in the feedback path. The zero in the feedback path creates a pole in the forward path and the programmed location of the zero influences the pole and controls the bandwidth of the forward path. The emitter-follower also buffers the differentiator so that it does not effect the operation of any prior gain stages in which the feedback system is used. A switch in the feedback path enables the differentiator to be turned off or switched out of the loop so that the forward path is not effected when bandwidth reduction is not required. With appropriate switching, the same differentiator is used to create a zero in the forward path as well as pole in the forward path.

20 Claims, 6 Drawing Sheets

READ CHANNEL WITH PROGRAMMABLE BANDWIDTH CONTROL

BACKGROUND OF THE INVENTION

1. Field of the Invention

The invention relates generally to devices which read information from a magnetic medium. More particularly, the invention concerns an improvement in a bandwidth control circuit in a read channel of such a device. The invention also relates to an improved feedback circuit for use in any information channel.

2. Description of the Prior Art

Magnetic recording devices are used to write information to a magnetic medium either in analog or digital form. The magnetic medium is typically a tape, such as used in the well known compact cassette or known high density drives for computers which are used for backup purposes. Another common form is a disc, such as a floppy disc or a hard disc for storing programs and data in a computer.

The read channel for a magnetic recording device includes a sensor in the form of a magneto-resistive head in close proximity with the magnetic medium. When the magnetic material is moved relative to the sensor, a flux is induced in the sensor in dependence of the local orientation of the magnetic material, thereby generating an information signal which can be amplified and then decoded.

When information is written in digital form, such as for computer data storage or digital recording of music, a current is passed through a thin film head in one direction to write a binary "0",and in the opposite direction to write a "1". When the medium is read by the sensor, or read head, the portions recorded with a binary "0" will induce a current in the head in the one direction and portions recorded with a binary "1" will induce a current in the opposite direction, which is then decoded by a bit detector.

A preamplifier is typically coupled to the sensor, and is the first in a series of blocks that process the analog signal from the sensor to the bit detector. It is desirable for the bandwidth of the preamplifier to be as wide band as possible so that the overall bandwidth of the read channel, from the preamplifier to the bit detector, is much larger than the nyquist frequency of data to maximize recovery of the signal. However, if the bandwidth of the preamplifier is too large, instabilities may occur due to signal and noise artifacts not being filtered away. The preamplifier is typically sold as an integrated circuit to manufacturers of magnetic recording/reading devices, such as hard disk drives. Since the instability problems depend on other components in the read channel selected by the manufacturer, manufacturers often specify that the preamplifier include programmable bandwidth reduction.

Known techniques for controlling bandwidth in an amplifier system include a programmable RC network in the signal path and programmable poles using a transconductance ($g_m$) stage in the forward path of a system. A disadvantage of the first approach is the it loads the signal path during times when it is not desired to reduce the bandwidth, due to the capacitances of the MOS switches which are typically employed to implement a programmable RC network. This is particularly not attractive in high frequency (i.e. high bit rate) systems. A disadvantage of the second approach is that it requires a multiplexor after the programmable pole stage, so as to switch that stage out of the signal path when bandwidth reduction is not required. Multiplexors require additional circuitry, requiring more silicon area.

SUMMARY OF THE INVENTION

Accordingly, there is a need for programmable band width control, in devices which read information from a magnetic medium, which does not load the signal path when bandwidth reduction is not needed and/or which does not require extra switching circuitry.

Generally speaking, according to one aspect of the invention, an apparatus with a read channel for reading information from a magnetic medium, includes a read sensor for generating an information signal in response to information stored on a magnetic medium. A gain stage coupled to the read sensor amplifies the information signal from the sensor, the gain stage having an output. A bandwidth control stage includes (i) an emitter-follower having an output, and an input coupled to the output of the gain stage, and (ii) a programmable feedback stage comprising a differentiator with a programmable zero, the feedback stage having an input coupled to the output of the emitter-follower and an output coupled to the output of the gain stage. The location of the zero in the feedback stage controls the bandwidth of the read channel.

One advantage of the above arrangement is that the emitter-follower is in the forward path and has a very wide band width, much wider than the other transconductance (gm) stages. Addition of the bandwidth control circuit, by itself, does not narrow the bandwidth. Another advantage is that the emitter-follower buffers the feedback stage from the gain stage, so that the current drawn by the feedback stage does not effect the operation of the prior gain stage.

According to another aspect of the invention, the programmable bandwidth stage is switchable between an active state, in which the programmable bandwidth stage reduces the bandwidth of the read channel in dependence on a state of the programmed zero, and an inactive state in which the programmable bandwidth stage substantially does not effect the information signal. This is easily implemented with a switch in the feedback stage. The advantage over known bandwidth control circuits is that the forward path is not effected when bandwidth reduction is not required.

According to yet another aspect of the invention, the gain stage includes a load resistor, and the output of the feedback stage is coupled across the load resistor.

The invention also relates to an integrated circuit embodying a preamplifier with bandwidth control.

According to another aspect of the invention, a feedback system includes an emitter-follower in the forward path as a gain stage, and a feedback stage coupling the output of the emitter-follower to the input of the emitter-follower. The feedback system may include switches to selectively switch the feedback stage between (i) the feedback path and (ii) a forward path in series with the emitter-follower. With the switches, a feedback stage which is a differentiator may serve as a differentiator while in the forward path and as an effective integrator while switched in the feedback path. The feedback system using the emitter-follower in the forward path as a gain stage can be used in any information channel.

These and other object, features and advantages of the invention will become apparent with reference to the following detailed description and the drawings.

DETAILED DESCRIPTION OF THE PREFERRED EMBODIMENTS

Figure 1:
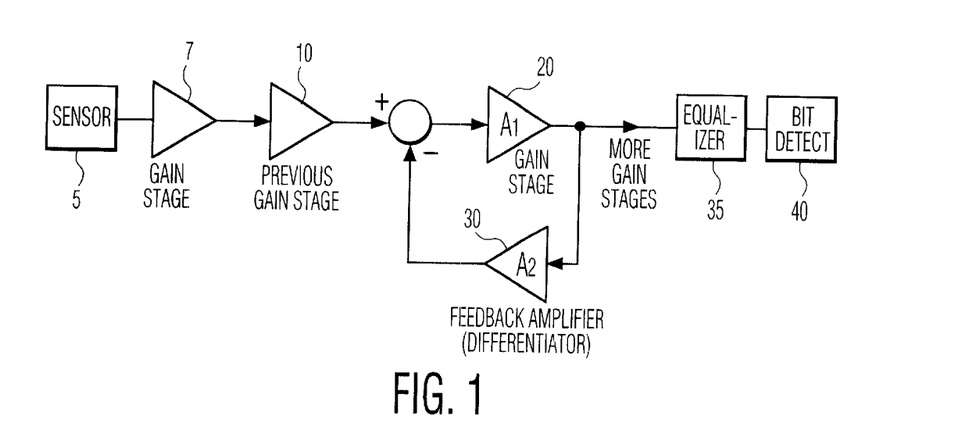
FIG. 1 is a simplified block diagram of a feedback loop according to the invention for implementing programmable bandwidth.

FIG. 1 illustrates the basic scheme for realizing a pole in the forward path of a read channel. The read channel typically has a plurality of gain stages, for example 3–5 stages, to amplify the signal from the read head so that it can be decoded by a decoding circuit within the device. FIG. 1 shows a gain stage 10 coupled via a prior gain stage 7 to a MR sensor 5. Another gain stage 20 is fed by the gain stage 10. The gain stage 20 feeds subsequent gain stages (not shown). Together, the gain stages 7, 10 and 20 and the subsequent gain stages (not shown) form a preamplifier which provides an amplified information signal to an equalizer 35 and a bit detector 40, which together form part of a decoder circuit, and which converts the analog information signal into a train of successive digital bits. The train of successive digital bits is then decoded according to an algorithm, depending on how the information was encoded when written to the magnetic medium.

According to the invention, the gain stage 20 is a unity gain amplifier implemented as an emitter-follower. Coupled to the emitter-follower gain stage 20 is feedback amplifier 30 implemented as a differentiator Gm stage with a single programmable zero. With this topology, a programmable pole is obtained in the forward path for bandwidth control with an amplifier 30 situated in the feedback path and having a programmable zero.

As used herein, a "pole" is defined as the value of the complex variable $s=j\omega=j2\pi f$ for which the transfer function $A(s)=\infty$ (infinity). A "zero" is defined as the value of s, where $A(s)=0$. Alternatively, as the context requires, the pole or zero is also referred to in terms of the frequency at which the transfer function is infinity or zero, respectively.

Figure 2:
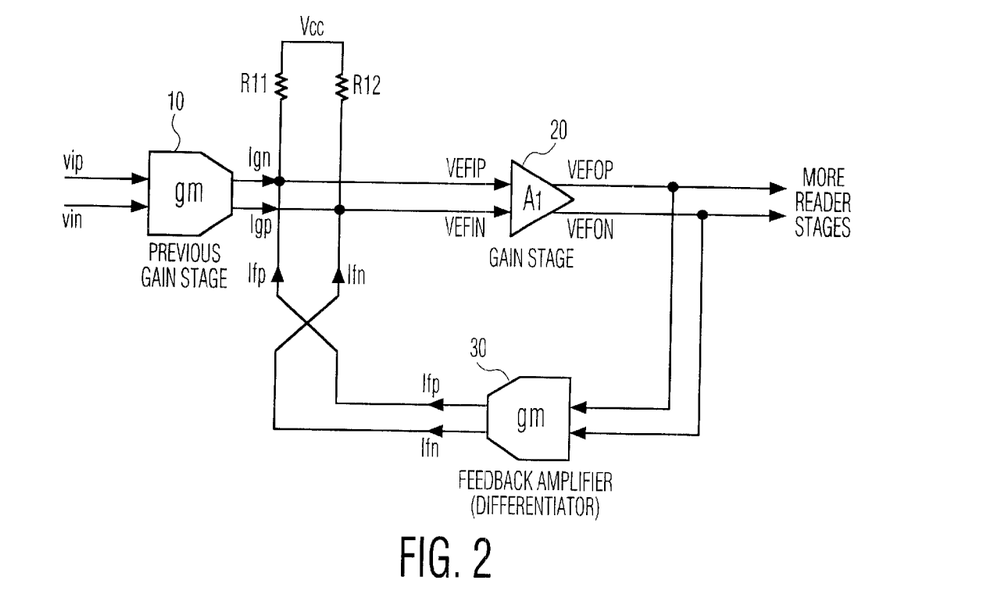
FIG. 2 is a block diagram showing the circuit of FIG. 1 in differential form, along with load resistors of the previous gain stage.

FIG. 2 shows the arrangement of FIG. 1 implemented as a differential circuit. The gain stage 10 includes first and second differential inputs Vip, Vin and first and second differential current outputs Ign, Igp. The differential outputs Vefop, Vefon of gain stage 20 feed respective differential inputs of the differentiator 30. The non-inverting and inverting differential outputs Ifp, Ifn of differentiator 30 are coupled respectively to the inverting and non-inverting outputs Ign, Igp of the prior gain stage 10. Load resistors R11, R12 of the prior gain stage 10 are coupled between voltage supply Vcc and the outputs Ign, Ifp and Igp, Ifn. Thus, the current feedback from the differentiater stage 30 is fed to the load resistors of the prior stage 10. The resulting voltage signals Vefip, Vefin fed to the differential inputs of the emitter-follower 20 are Vefip=Vcc−(R11(Ign−Ifp); Vefin=Vcc−(R12 (Igp−Ifn).

Figure 3:
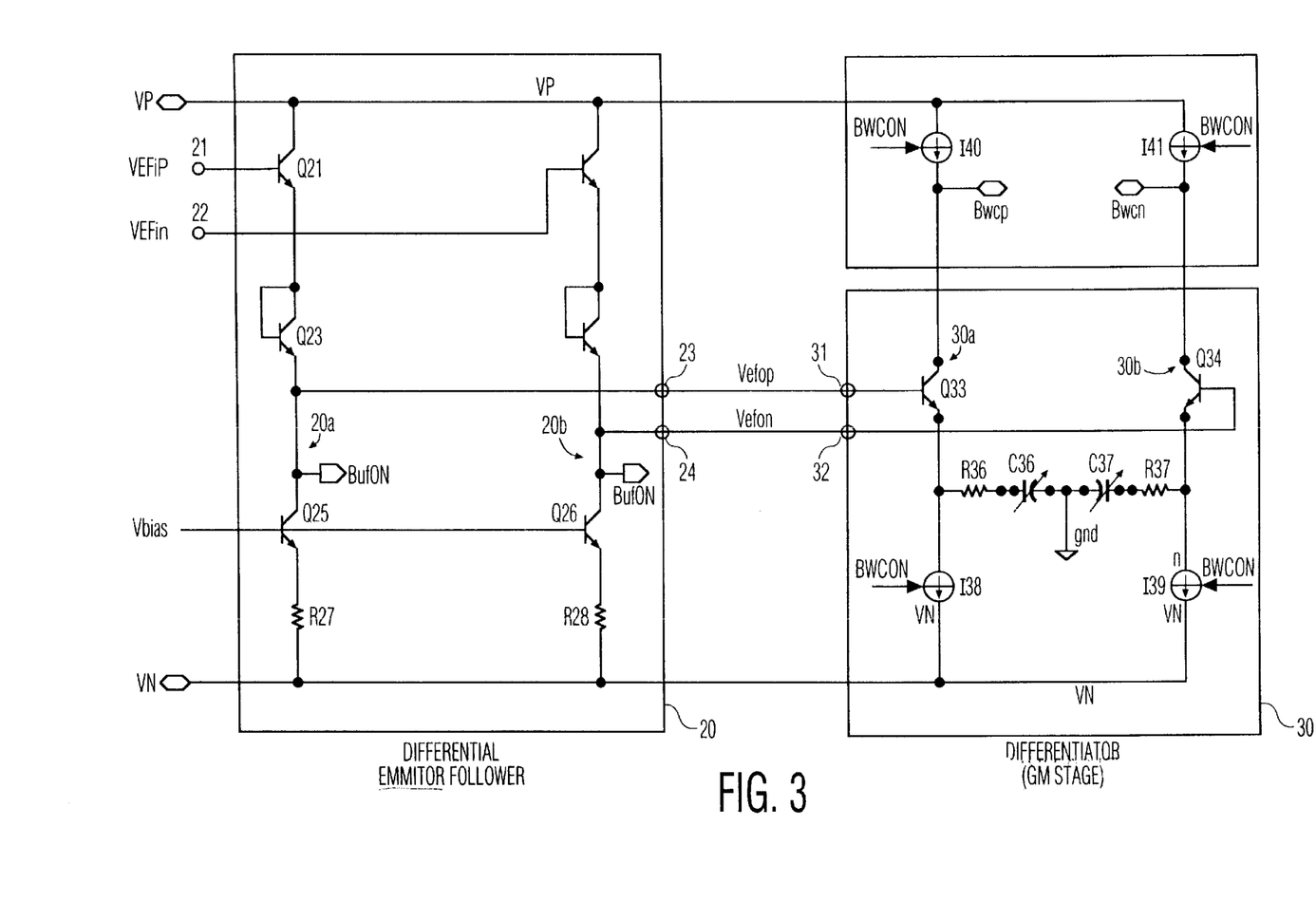
FIG. 3 is circuit schematic of the differential EMITTER follower for the gain stage and the differentiator Gm stage with single programmable zero as the feedback stage.

FIG. 3 shows the circuit diagram for the gain stage 20 as well as differentiator stage 30. The gain stage 20 is a differential emitter-follower with first and second circuit branches 20a, 20b operating between a first voltage supply rail VP and a second, lower voltage supply rail VN. Branch 20a includes a bipolar transistor Q21 having a collector coupled to the first supply rail, an emitter coupled to the collector of a diode-connected transistor Q23, and a base coupled to a first differential input 21, which receives the first differential output voltage signal Vefip (FIG. 2). The emitter of the transistor Q23 is coupled to the collector of a bipolar transistor Q25, the emitter of which is coupled to the second supply rail VN via resistor R27. The base of the transistor Q25 receives a bias tuning voltage Vbias. The second branch 20b is identical to the first branch 20a, with the exception that the base of the transistor Q23 is coupled to a second differential input 22 which receives the voltage signal Vefin.

In branch 20a, the collector of the transistor Q21 is coupled directly to the higher supply rail VP. The diode-connected transistor Q23 merely serves to level shift the emitter voltage of transistor Q21 by one diode drop. The single-ended input port is between supply rail VP and input 21 while the output port is between output 23 and supply rail VP. Since the supply rail is common to the input and output ports, the emitter voltage follows the base voltage, defining an emitter-follower. The voltage gain of an emitter-follower is slightly less than unity, but is generally treated as a unity gain device. Thus, the voltage at output 23 will follow that at input 21. Branch 20b, being identical, operates in the identical fashion. This, in the emitter-follower 20, Vefop at output 23 equals Vefip less two diode drops (Q21, Q23) and Vefon at output 24 equals Vefin less two diode drops.

The bias transistors Q25, Q26 in combination with the resistors R27, R28 provide an equal bias current to the emitters of the transistors Q22, Q24. The emitter-follower acts as a buffer so that the current drawn by the differentiater stage does not load, and does not affect the operation of the previous gain stage 10.

The feedback differentiater stage 30 includes a first branch 30a, and a second branch 30b. The first branch includes a transistor Q33 having a collector, a base coupled to the input 31 to receive the first differential output voltage Vefop from the emitter follower 20, and an emitter biased by a constant current source I38. Similarly, the second branch includes bipolar transistor Q34 having a collector, a base coupled to a second differential input 32 receiving the differential output voltage Vefon and an emitter biased by a second constant current source I39. Coupled between the emitters of the transistors Q33, Q34 is a programmable RC network consisting of the series string R36, C36, C37, R37. The capacitors C36, C37 are programmable, and serve to program the pole of the closed loop, or zero of the differentiator 30. Additionally, current sources I40 and I41 are coupled in the branches 30a, 30b between supply rail VP and the collectors of the transistor Q23, Q24. The current sources I38-I41 receive a control signal BWCON, supplied by a control logic circuit of FIG. 4, which is used to turn the stage 30 on and off.

The outputs of the differentiater 30 are the currents Ifp, Ign provided at outputs Bwcp, Bwcn, respectively, which are coupled to the load resistors R10, R11 as in FIG. 2. The current sources I38, I39 provide a bias current to the emitters of the transistors Q33, Q34. Being a transconductance stage, the transistors Q33, Q34 convert the small signal voltage Vefop, Vefon into currents Igf, Ign which are proportional to the signal voltages Vefop, Vefon. The current sources I40, I41 replace the current drawn by the collectors of the transistors Q33, Q34 so that the DC current at the outputs BWCP, BWCN is substantially zero, and therefor does not load and effect the operation of the prior gain stage. The operation of the current sources I38–I41 and a bias circuit for controlling these current sources will be further discussed with reference to FIG. 6.

Mathematically, the circuit according to the invention can be described as follows. The closed loop transfer function of the loop formed by amplifier 20 and differentiator 30 is $$Av = A_1/(1 + A_1 * A_2),$$

where: $A_1$ is the transfer function of the amplifier 20, and $A_2$ is the transfer function of the amplifier 30. If the differentiator 30 has a zero at f=0, where f is frequency of the input signal, then the transfer function is of the form $$A_2 = A'_2 j \omega C,$$

where: j is the imaginary variable ($j^2 = -1$)
ω is the wavelength of the signal, and
C is the capacitance of the gain stage $A_2$ corresponding to the value of capacitance C36.

Where $A'_2$ is constant, the closed loop transfer function will have a pole at wp=1/($A_1 * A'_2 * C$).

With the emitter-follower as the gain stage 20, the feedback stage 30 is a differentiator with a single zero. The transconductance of each branch of this stage is given by $$G_m = 1/(R_d + 1/gm_{Ti} + 1/j\omega C_d),$$

where: $R_d$ is the resistance of a branch, corresponding to the resistor R36 or R37;
$gm_{Ti}$ is the transconductance of the transistor Q33 or Q34; and
$C_d$ is the capacitance of a branch, corresponding to C36, C37. The output of the feedback stage is fed back across the load resistor of the previous gain stage. Denoting the value of the load resistors of the previous gain stage as $R_L$, the open loop gain "$A_{vol}$" becomes $$A_{vol} = A_1 * R_L/(R_d + 1/gm_{Ti} + 1/j\omega C_d).$$

As discussed above, the gain stage 20 has a transfer function |A1|=1 and has a pole at very high frequency, thus $$A_{vol} = R_L/(R_d + 1/gm_{Ti} + 1/j\omega C_d).$$

The resistance Rd is very important to implementing the feedback loop. Rd must be selected to so that the loop gain can be limited to a desired value (=$R_L/(R_d + 1/gm_{Ti})$). This provides significant loop stability. Without the resistance Rd, the feedback gain would keep increasing with frequency and, at a certain frequency, could result in positive feedback, causing oscillations.

Figure 4:
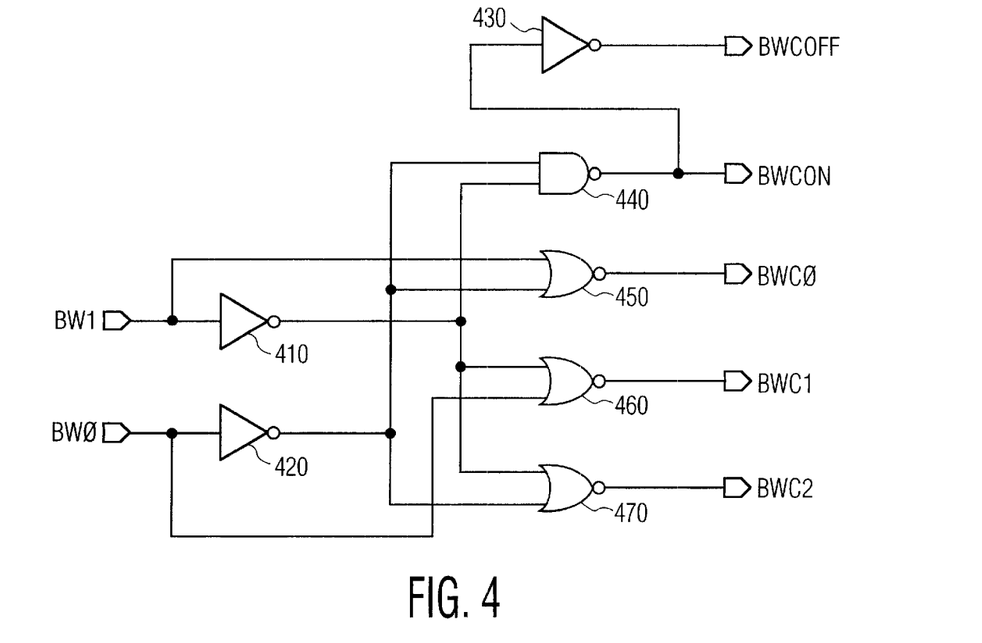
FIG. 4 is logic diagram for generating program signals for programming the differentiator stage.

FIG. 4 is a logic circuit which generates program signals to program the poles of the Gm stage 30. The logic circuit includes two inputs BW1 and BW0 feeding two inverters 410, 420. The inputs BW1, BW0 and the inverting outputs of the inverters 410, 420 feed a number of logic gates 430–470 to generate BWCOFF (bandwidth control off), BWCON (bandwidth control on), and three control bits BWC0, BWC1 and BWC2. The inverting outputs of the two inverters 410, 420 are coupled to the inputs of NAND gate 440. The output of NAND gate 440 feeds the input of inverter 430, so that the BWCOFF and BWCON signals are mutually exclusive. When both inputs BW1, BW0 are logic low, BWCON will be logic low and BWCOFF will be logic high. When either or both inputs is logic high, the signal BWCON will be logic high and BWCOFF will be logic low. NOR gate 450 has one input coupled to input BW1 and another input coupled to the output of inverter 420. NOR gate 460 is fed by the output of inverter 410 and by the input BW0 and NOR gate 470 is fed by the output of both inverters 410, 420. Table 1 is the truth table for the logic circuit of FIG. 4 illustrating how the outputs vary with the inputs BW1, BW0.

TABLE 1

| BW1    | 0 | 0 | 1 | 1 |
|--------|---|---|---|---|
| BW2    | 0 | 1 | 0 | 1 |
| BWCOFF | 1 | 0 | 0 | 0 |
| BWCON  | 0 | 1 | 1 | 1 |
| BWC0   | 0 | 1 | 0 | 0 |
| BWC1   | 0 | 0 | 1 | 0 |
| BWC2   | 0 | 0 | 0 | 1 |

Figure 5:
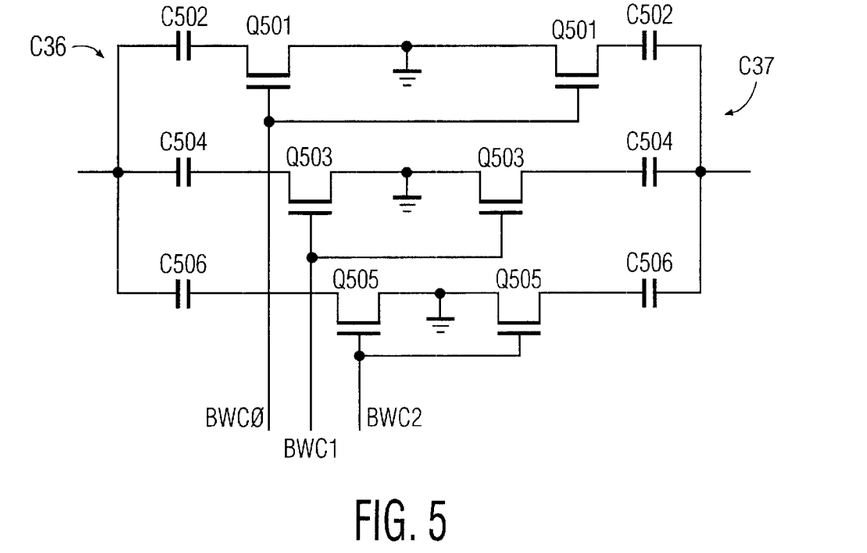
FIG. 5 shows the programmable capacitance Cd of the differentiator stage.

FIG. 5 is a circuit diagram of the programmable capacitances C36 and C37 of the differentiator stage. The programmable capacitances include three branches coupled in parallel to each other, each one of the branches being controlled by one of the control signals BC0, BC1, BC2. The first branch includes a first switch Q501 in series with a capacitor C502, the second branch includes a second switch Q503 in series with a second capacitor C504, and the third branch includes a third switch Q505 in series with a third capacitor C506. The switches are shown here as MOSFETs. The control electrode, in this case the gate, of each of the switches is controlled by a respective one of the program signals BC0, BC1, BC2. Here the switches are normally open, and are rendered conductive when the respective program signals is logic high. The capacitors C501, C502 and C503 have different values. Accordingly, when signal BCO is logic high and the others are logic low, the programmable capacitor Cd has a value equal to C501. Similarly, the programmable capacitor will have a value equal to C502 when signal BC1 is logic high and a value equal to C503 when signal BC2 is logic high. Thus, by programming the inputs BW1, BW0 of the logic circuit of FIG. 4, different values are selected for the programmable capacitor Cd, and thus the pole of the differentiator stage is adjusted to control the bandwidth of the read channel.

Figure 6:
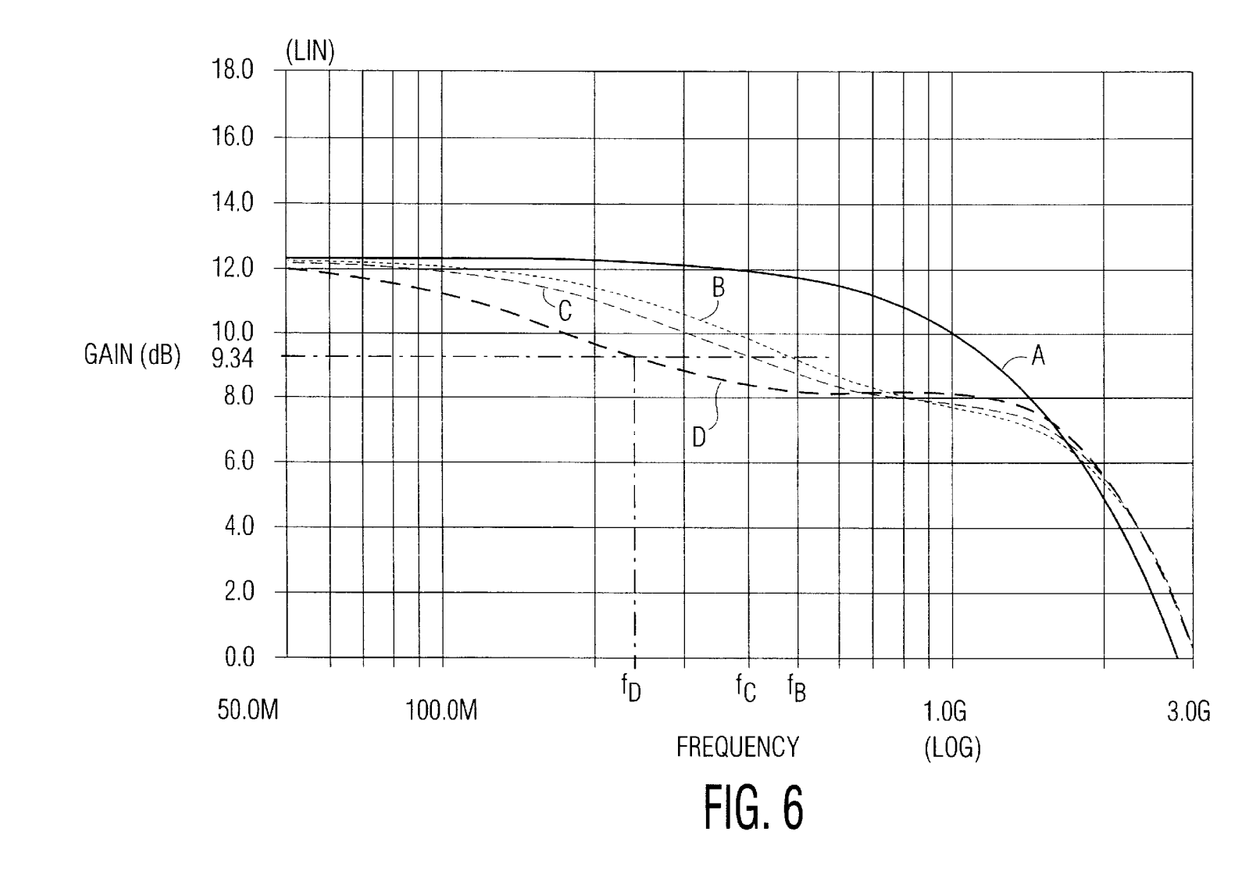
FIG. 6 is a graph illustrating reduction of bandwidth by the circuit according to the invention.

FIG. 6 illustrates the effect of the bandwidth programming. In FIG. 6, the gain in dB (vertical axis) of the prior gain stage 10, emitter-follower 20 and feedback loop 30 is plotted verses the log (base 10) of the frequency of the input signal to these stages. The output of the previous gain stage in this example was 12.34 dB, and the curve representing no bandwidth reduction is the solid line labeled "A". The curves labeled "B", "C", and "D" represent successively greater bandwidth reductions. The location of the pole in the forward path for bandwidth reduction is the frequency at which there is a 3 dB reduction in the gain, in other words where each of the curves B, C, D intersect 9.34 dB in the graph. For curves, D, C and B, these frequencies are $f_D$, $f_C$, $f_B$, respectively.

Figure 7A:
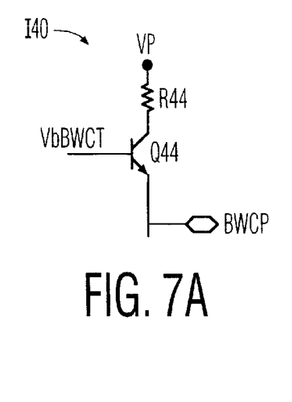
FIGS. 7a; 7b illustrate the current sources I40, I38 of FIG. 2.
Figure 7B:
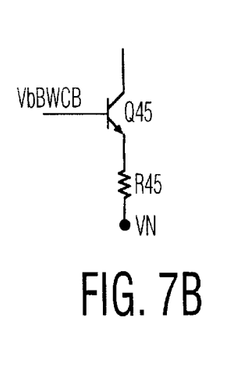

FIG. 7a illustrates the current source I40 of FIG. 3 which includes a bipolar PNP transistor Q44 having its emitter coupled to supply rail VP via a resistor R44, a collector coupled to the output BWCP, and a base coupled to receive a bias voltage VbBWCt. FIG. 7b illustrates the current source I38 of FIG. 3 which includes a NPN bipolar transistor Q45 having a collector (coupled to the emitter of transistor Q33), a base coupled to receive a bias voltage VbBWCb, and a emitter coupled to the supply rail VN via a resistor R45.

Figure 7C:
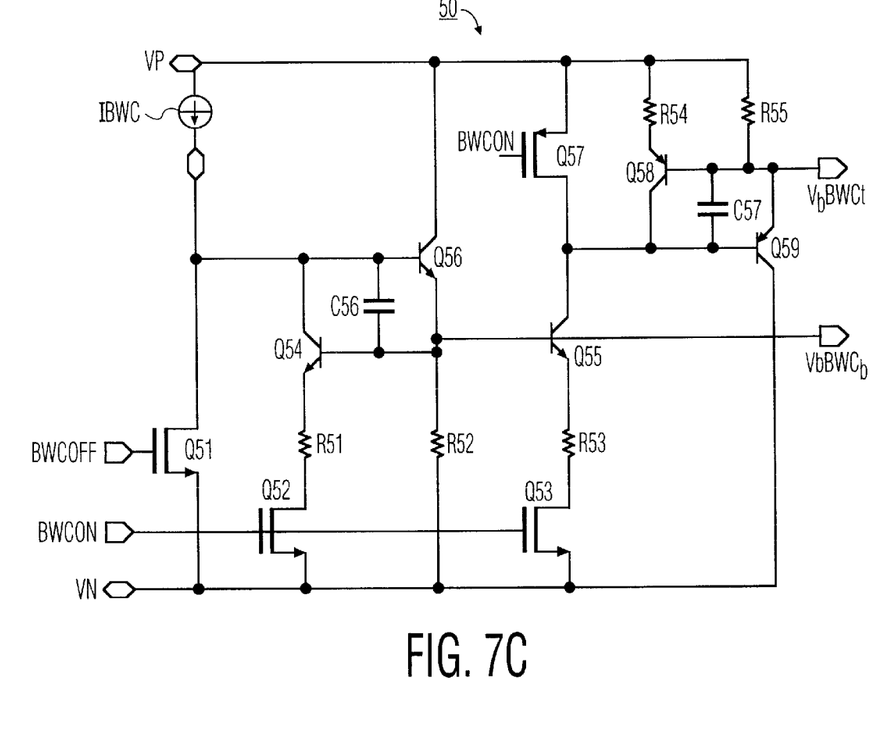
FIG. 7c is a circuit diagram of a bias circuit for controlling the current sources I38, I40.

FIG. 7C is a circuit diagram of a bias circuit 50 which generates the bias voltages VbBWCt and VbBWCb, along with current IBWC. The bias circuit operates between supplies rails VP, VN and has inputs receiving control signals BWCOFF, BWCON generated by the logic circuit of FIG. 4. MOSFET switch Q51 has a control gate coupled to receive BWCOFF, a source coupled to the supply rail VN and a drain coupled to the terminal IBWC. MOSFET switches Q52 and Q53 each have a control gates coupled to receive the input signal BWCON and a source coupled to the rail VN. The drain of the transistor Q52 is coupled to the emitter of a bipolar transistor Q54 via a resistor R51. The collector of transistor Q54 is coupled to the drain of MOSFET Q51, one end of a capacitor C56, and the base of bipolar transistor Q56. The other end of the capacitor C56 is coupled to the base of the transistor Q54 and to the emitter of the transistor Q56. The emitter of the transistor Q56 is coupled to the rail VN via a resistor R52. The switch Q53 has its drain coupled to the emitter of a bipolar transistor Q55 via a resistor R53. The base of the transistor Q55 is commonly coupled to the base of the transistor Q54, the emitter of the transistor Q56 and the output terminal VbBWCb. The collector of the transistor Q55 is coupled to the supply rail VP via a MOSFET switch Q57, whose base is coupled to receive the control signal BWCON. A bipolar PNP transistor Q59 has its emitter coupled to the output terminal VbBWCt and to the supply rail VP via a resistor R55. A PNP bipolar transistor Q58 has its collector coupled to the base of the transistor Q59, to one end of the capacitor C57, and to the source of MOSFET Q57. The emitter of the transistor Q58 is coupled to the rail VP via a resistor R54.

When the signal BWCON is logic high, the MOSFETs Q52, Q53 are conductive and MOSFETs Q51 and Q57 are OFF. The current through branch IBWC flows through NPN transistor Q54 and is mirrored by NPN transistor Q55. The current through transistor Q55 flows through PNP transistor Q58 and resistor R54. The bias voltage VbBWCt is generated such that VP−VbBWCt=VBE+IBWC*R54. The bias voltage VbBWCb provides VbBWCb−VN=VBE+IBWC*R53. Since IBWC is mirrored accurately (with base current compensation using transistors Q56 and Q54) with R54=R53, the difference of voltages with the two rails VP and VN are equal. These bias voltages VbBWCt and VbBWCb are used in the current sources of FIG. 7a and FIG. 7b, respectively. The resistors R44 and R45 are made equal to the resistors R54 and R53 so as to achieve equal current generated from current sources I38–I41.

Figure 8:
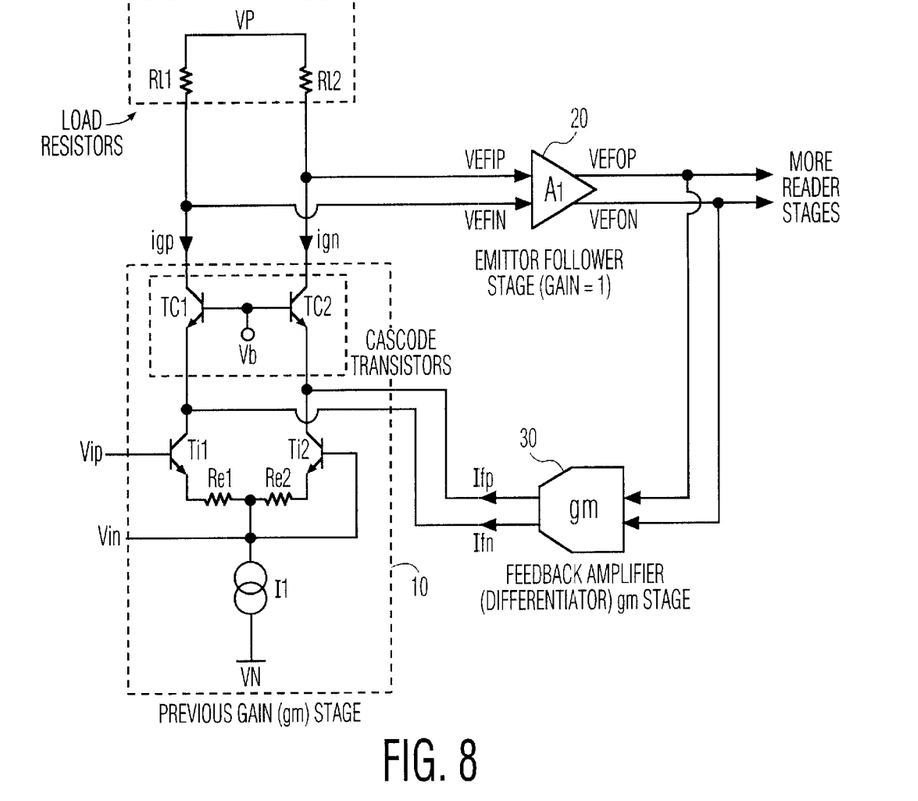
FIG. 8 is a simplified schematic diagram showing a desirable coupling of the output of gain stage 30 to the prior gain stage.

FIG. 8 shows the feedback loop for the bandwidth programming circuit. The previous gain stage 10, diagrammatically shown in FIGS. 1 and 2, is explicitly illustrated and includes cascode transistors Tc1, Tc2 coupled between the load resistors R11, R12 and transconductance transistors Ti1, Ti2, respectively. The gain stage 20 is a differential emitter-follower stage as discussed earlier (gain=1). The feedback stage 30 is the differentiator gm stage. FIG. 8 illustrates a preferred method of feeding back the output current Ifp, Ifn of the differentiator stage, by adding it below the cascode transistors Tc1, Tc2 of prior gain stage 10 so that the gm stage does not capacitively load nodes VEFIP, VEFIN in the forward path.

An advantage of using an emitter-follower as a gain stage in the forward path of a feedback system is that read channels conventionally include a number of buffers in the forward path, i.e. the information path extending from the sensor to the bit decoder. Any one of these emitter-followers can be used as the gain stage in the feedback system loop as proposed. In other words, the feedback loop can be formed in the read channel anywhere an emitter-follower already exists. Thus, this gain stage implementation does not require extra silicon area for the gain stage for implementing programmable bandwidth control.

Additionally, the bandwidth of the emitter follower stage is very large. The open loop gain/phase response of the loop can be almost independent of the forward path gain stage. This allows a simplified feedback system. This is in contrast to prior art systems where the poles in the forward path gain stage reduced the gain phase margin of the system requiring a complex compensation scheme.

Note that when no bandwidth reduction is desired, the feedback amplifier 30 is merely switched off by turning off current sources I38–I41 under control of the logic circuit of FIG. 4. In this way, no feedback currents are added to the signal path so that the normal bandwidth is not affected. This contrasts to conventional circuits where the programmability in the forward path, and can not be turned off without affecting the signal path.

Figure 9:
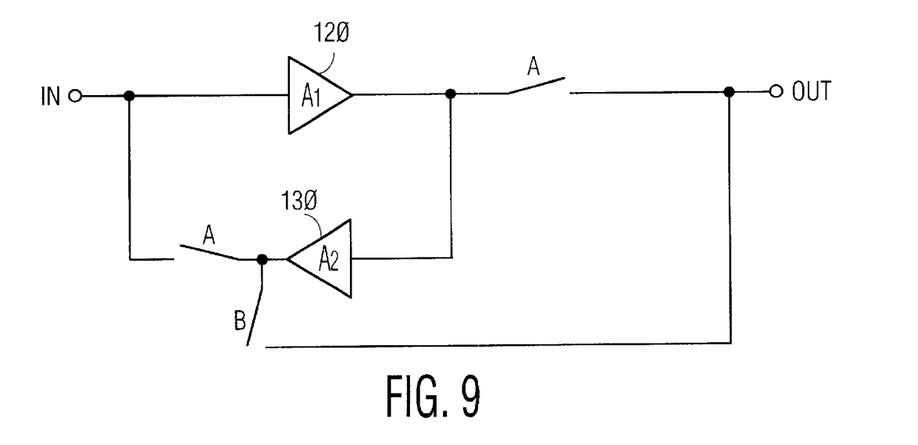
FIG. 9 illustrates a feedback loop according to the invention for use in information channels generally.

FIG. 9 illustrates an additional embodiment in which an integrated circuit includes a feedback system with an emitter-follower 120 in the forward path as gain stage and a feedback stage 130 in a feedback path which couples the output of the emitter-follower to the input of the emitter-follower. For the reasons noted above with respect to the bandwidth control circuit, an emitter-follower in the forward path of an feedback system is advantageous because of its high bandwidth. Also, as emitter-followers are normally used as buffers in many systems, a feedback loop can be easily formed by adding a feedback stage to an existing emitter-follower. FIG. 9 also gives an example of how a switching arrangement can be employed so that a feedback stage 130 can perform a dual role. When the switches "A" are closed and the switch "B" is open, the feedback stage 130 is in the feedback path, coupling the feedback stage 30 between the output and the input of the emitter-follower. With the switches "A" open and the switch "B" closed, the stage 130 is now coupled in the forward path in series with the emitter-follower 120, with the output of stage 130 coupled to the output OUT instead of to the input of emitter-follower 120. Thus, if the stage 130 is a differentiator as in FIG. 1, when in the feedback path it serves as an effective integrator (the zero creates a pole in the forward path) while when coupled in the forward path directly to the output terminal 'OUT' it serves as a differentiator. Thus, a switching arrangement can lead to even further savings of die area.

The process or technology by which the of the invention is made is not important and any of the standard bipolar or CMOS processes can be used.

Although preferred embodiments of the present invention have been shown and described, it will be appreciated by those skilled in the art that changes may be made in these embodiments without departing from the principles and spirit of the invention, the scope of which is defined in the claims. For example, it will be clear from the foregoing that The many features and advantages of the invention are apparent from the detailed specification and it is intended by the appended claims to cover all such features and advantages which fall within the true spirit and scope of the invention. Since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. An apparatus with a read channel for reading information from a magnetic medium, said read channel having a programmable bandwidth comprising:

a sensor for generating an information signal in response to information stored on the magnetic medium;

a gain stage for amplifying the information signal from said sensor, said gain stage having an output; and a bandwidth control stage comprising (i) an emitter follower having an output, and an input coupled to said output of said gain stage, and (ii) a programmable feedback stage comprising a differentiator with a programmable zero, said feedback stage having an input coupled to said output of said emitter-follower and an output coupled to said output of said gain stage, and the location of the zero controlling the bandwidth of said read channel.

2. An apparatus according to claim 1, wherein said differentiator comprises a programmable capacitance for programming the zero.

3. An apparatus according to claim 1, wherein said bandwidth control stage is switchable between an active state, in which said bandwidth control stage reduces the bandwidth of said read channel in dependence on a state of the programmed zero, and an inactive state in which said bandwidth control stage substantially does not effect the information signal.

4. An apparatus according to claim 1, wherein said gain stage includes a load resistor, and said output of said feedback stage is coupled across said load resistor.

5. An apparatus according to claim 4, wherein said feedback stage has a transconductance given by $G_{mf}=1/(R_d+1/gm_{T1}+1/j\omega C_d)$ and the gain of the bandwidth reduction stage is limited to $R_1/(R_d+1/gm_{Ti})$, wherein $R_d$ is the resistance of a branch of said bandwidth control stage; $C_d$ is the transductance of a transistor of said branch of said bandwidth control stage; and $R_1$ is the load resistance of the gain stage.

6. An apparatus according to claim 1, wherein said gain stage, emitter follower, and feedback stage are differential stages.

7. An apparatus according to claim 1, wherein said emitter-follower has a pair of differential voltage inputs, said gain stage includes a pair of transconductance transistors each coupled to a respective said differential voltage input, and a pair of cascode transistors each coupled to a respective one of said transconductance transistors, and said differentiator has a pair of current outputs each coupled between a respective said cascode transistor and a respective transconductance transistor.

8. An apparatus according to claim 1, further comprising an equalizer and a bit detector coupled to said output of said emitter-follower for decoding the information signal.

9. An apparatus according to claim 1, wherein said apparatus is a hard disk drive.

10. An apparatus according to claim 1, wherein said gain stage and said bandwidth control circuit are embodied together in an integrated circuit.

11. An integrated circuit, comprising:

a gain network for amplifying a signal, the gain network including at least one gain stage having an output; and a bandwidth control stage comprising (i) an emitter-follower having an output, and an input coupled to said output of said at least one gain stage, and (ii) a programmable feedback stage comprising a differentiator with a programmable zero, said feedback stage having an input coupled to said output of said emitter-follower and an output coupled to said output of said at least one gain stage, and the location of the zero controlling the bandwidth of said gain network.

12. An integrated circuit according to claim 11, wherein said differentiator comprises a programmable capacitance for programming the zero of said differentiator.

13. An integrated circuit according to claim 11, wherein said bandwidth control stage is switchable between an active state, in which said bandwidth control stage reduces the bandwidth of said gain network in dependence on a state of the programmed zero, and an inactive state in which said bandwidth control stage substantially does not effect the bandwidth of said gain network.

14. An integrated circuit according to claim 11, wherein said at least one gain stage includes a load resistor, and said output of said feedback stage is coupled across said load resistor.

15. An integrated circuit according to claim 14, wherein said feedback stage has a transconductance given by $G_{mf}=1/(R_d+1/gm_{Ti}+1/j\omega C_d)$ and the gain of said bandwidth control stage is limited to $R_1/(R_d+1/gm_{Ti})$ wherein $R_d$ is the resistance of a branch of said bandwidth control stage; $C_d$ is the transductance of a transistor of said branch of said bandwidth control stage; and $R_1$ is the load resistance of said at least one gain stage.

16. An integrated circuit including to claim 11, wherein said at least one gain stage, emitter-follower, and feedback stage are differential stages.

17. An integrated circuit according to claim 16, wherein said emitter-follower has a pair of differential voltage inputs, said gain stage includes a pair of transconductance transistors each coupled to a respective said differential voltage input, and a pair of cascode transistors each coupled to a respective one of said transconductance transistors, and said differentiator has a pair of current outputs each coupled between a respective said cascode transistor and a respective transconductance transistor.

18. An integrated circuit, comprising:

a forward data path including an emitter-follower as a gain stage, the emitter-follower having an input and an output; and a feedback path with a stage coupling the output of the emitter-follower to the input of the emitter-follower, wherein said stage is a differentiator.

19. An integrated circuit according to claim 18, further including switches for selectively switching said differentiator between (i) said feedback path and (ii) the forward data path in series with said emitter-follower.

20. An integrated circuit, comprising:

a forward data path including an emitter-follower as a gain stage, the emitter-follower having an input and an output;

a feedback path with a stage coupling the output of the emitter-follower to the input of the emitter-follower; and switches for selectively switching said stage between (i) said feedback path and (ii) the forward data path in series with said emitter-follower.

* * * * *

Disclaimer

6,473,253 B1 — Sanjay Manohar Bhandari, Santa Clara, CA (US); David Allouche, Belmont, CA (US). READ CHANNEL WITH PROGRAMMABLE BANDWIDTH CONTROL. Patent dated October 29, 2002. Disclaimer filed March 28, 2008, by the assignee, Koninklijke Philips Electronics N.V.

Hereby enters this disclaimer to all claims of said patent.

*(Official Gazette, April 7, 2009)*